US006287429B1

(12) United States Patent
Moroishi et al.

(10) Patent No.: US 6,287,429 B1
(45) Date of Patent: *Sep. 11, 2001

(54) MAGNETIC RECORDING MEDIUM HAVING AN IMPROVED MAGNETIC CHARACTERISTIC

(75) Inventors: Keiji Moroishi; Junichi Horikawa; Masato Kobayashi; Osamu Nozawa, all of Tokyo (JP)

(73) Assignee: Hoya Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/312,162

(22) Filed: May 14, 1999

Related U.S. Application Data

(62) Division of application No. 08/929,244, filed on Sep. 10, 1997, which is a continuation of application No. 08/506,248, filed on Jul. 24, 1995, now abandoned, which is a continuation of application No. 08/142,228, filed on Oct. 22, 1993, now abandoned.

(30) Foreign Application Priority Data

| Oct. 26, 1992 | (JP) | 4-311224 |
| Aug. 31, 1993 | (JP) | 5-215422 |
| Oct. 8, 1993 | (JP) | 5-252955 |

(51) Int. Cl.$^7$ ................................................. C23C 14/34
(52) U.S. Cl. ............................... 204/192.2; 204/192.16
(58) Field of Search ....................... 204/192.15, 192.16, 204/192.2; 427/128, 131

(56) References Cited

U.S. PATENT DOCUMENTS

| 4,438,066 | * | 3/1984 | Aboaf et al. | 420/435 |
| 4,778,582 | * | 10/1988 | Howard | 204/192.15 |
| 4,833,020 | | 5/1989 | Shiroishi | 428/330 |
| 4,883,711 | | 11/1989 | Shiroishi | 428/330 |
| 4,902,583 | * | 2/1990 | Brucker et al. | 428/665 |
| 5,023,148 | | 6/1991 | Fisher | 428/694 |
| 5,024,903 | | 6/1991 | Mizukami | 428/694 |
| 5,047,297 | | 9/1991 | Wakamatsu | 428/694 |
| 5,051,288 | | 9/1991 | Ahlert | 428/64 |
| 5,069,983 | | 12/1991 | Nakamura | 428/694 |
| 5,143,794 | * | 9/1992 | Suzuki et al. | 428/611 |
| 5,147,732 | * | 9/1992 | Shiroishi et al. | 428/668 |
| 5,466,522 | * | 11/1995 | Freeman et al. | 428/332 |
| 5,824,427 | * | 10/1998 | Kobayashi et al. | 428/694 TS |
| 5,900,324 | * | 5/1999 | Moroishi et al. | 428/611 |
| 6,020,060 | * | 2/2000 | Yoshida et al. | 428/332 |

OTHER PUBLICATIONS

JP 59–171031 Abstract, Sep. 1984.*

Tani, et al. "Effects of Substituted Elements into the CR Layer on a Go N.CR/CR Sputtered Hard Disk" in Journal of the Applied Physics 67(12), Jun. 15, 1990, pp. 7507–7509.

* cited by examiner

*Primary Examiner*—Nam Nguyen
*Assistant Examiner*—Steven H. VerSteeg
(74) *Attorney, Agent, or Firm*—Ladas and Parry

(57) ABSTRACT

A magnetic recording medium comprises a non-magnetic substrate having a principal surface, an intermediate layer formed on the principal surface, and a magnetic layer formed on the intermediate layer. The intermediate layer comprises an intermediate material composed of chromium and molybdenum. The magnetic layer comprises a magnetic material composed of cobalt and platinum. The intermediate layer may comprise first and second layers. The first layer comprises a first material composed of chromium and is formed on the principal surface. The second layer comprises a second material composed of chromium and molybdenum and is formed on the first layer.

4 Claims, 6 Drawing Sheets

MAGNETIC RECORDING MEDIUM HAVING AN IMPROVED MAGNETIC CHARACTERISTIC

CROSS-RELATED APPLICATIONS

This application is a division of Ser. No. 08/929,244 filed Sep. 10, 1997 which in turn is a continuation of Ser. No. 08/506,248 filed Jul. 24, 1995 now abandoned which in turn is a continuation of Ser. No. 08/142,228 filed Oct. 22, 1993 now abandoned.

BACKGROUND OF THE INVENTION

This invention relates to a magnetic recording medium for use in recording information at a high density. It is to be noted throughout the instant specification that a magnetic disk will be mainly described as an example of the magnetic recording medium hereinunder and will be included in a magnetic disk device, although this invention is not restricted to the magnetic disk or the magnetic disk device.

A magnetic disk of the type described, comprises a non-magnetic substrate and a magnetic layer. A cobalt-platinum (Co—Pt) alloy is generally used as the magnetic layer. In order to record information at a high recording density on the magnetic disk, it is necessary to increase a characteristic of magnetism such as a coercive force (Hc) and a product of remanence and a thickness of the magnetic layer. A conventional magnetic disk of the above-mentioned type is disclosed in Journal of the Institute of Television Engineer of Japan, Vol. 40, No. 6, 1986, pages 475 to 480, and will be referred to as a first conventional magnetic disk.

The first conventional magnetic disk comprises the non-magnetic substrate of a glass and the magnetic layer of Co—Pt—Mo. The magnetic layer is directly formed on the non-magnetic substrate. It is possible to control the coercive force within a wide range by the changing of the amount of Mo and to record information at a high recording density in the first conventional magnetic disk.

When the amount of Mo increases in the magnetic layer of the first conventional magnetic disk, a reduction has been observed in the coercive force of the first conventional magnetic disk. For example, the coercive force of the first conventional magnetic disk becomes to about 350 oersteds when Mo is included in the magnetic layer at about 14 atomic percents. In addition, a saturation magnetic flux density reduces in the first conventional magnetic disk in proportion as Mo increases in the magnetic layer. As a result, the product of remanence and thickness of the magnetic layer reduces.

As described above, it is difficult to increase the coercive force and the product of remanence and thickness of the magnetic layer in the first conventional magnetic disk. Namely, it is difficult to record information at a high recording density.

Another conventional magnetic disk is disclosed in Japanese Patent Publication No. Heisei 4-16848, namely, 16848/1992 and will be referred to as a second conventional magnetic disk. The second conventional magnetic disk comprises the non-magnetic substrate, an intermediate layer formed on the non-magnetic substrate, and the magnetic layer formed on the intermediate layer. The intermediate layer consists of a Cr—V alloy or a Cr—Fe alloy. The magnetic layer consists of the Co—Pt alloy. It is possible to increase the coercive force and to make a rectangular magnetization curve be improved in the second conventional magnetic disk.

However, the coercive force is about 1600 oersteds at a maximum level in the second conventional magnetic disk. The maximum level is not enough as the coercive force on recording information at the high recording density.

Still another conventional magnetic disk is disclosed in Journal of the Applied Physics, 67(12), 15 June 1990, pages 7507 to 7509 and will be referred to as a third conventional magnetic disk. The third conventional magnetic disk comprises the non-magnetic substrate, the intermediate layer of a Cr—Mo alloy, and the magnetic layer of a Co—Ni—Cr alloy.

However, the coercive force is about 1120 oersteds in the third conventional magnetic disk. As a result, it is difficult to record information at the high recording density.

As readily understood from the above description, it is difficult to record information at high recording density in each of the first through the third magnetic disk. Namely, it is difficult to render characteristic of magnetism great in each of the first through the third magnetic disk.

SUMMARY OF THE INVENTION

It is an object of this invention to provide a magnetic medium capable of improving a magnetic characteristic.

Other objects of this invention will become clear as the description proceeds.

According to a first aspect of this invention, there is provided a magnetic recording medium comprising a non-magnetic substrate having a principal surface, an intermediate layer formed on the principal surface, and a magnetic layer formed on the intermediate layer. The intermediate layer comprises an intermediate material composed of chromium and molybdenum. The magnetic layer comprises a magnetic material composed of cobalt and platinum.

In the first aspect of this invention, Cr and Mo become a solid solution in the intermediate layer. Lattices in the intermediate layer expand according to the amount of Mo so that a lattice distance on (110) face of Cr approaches the (002) face of the magnetic layer comprising Co and Pt. As a result, it is possible to improve coercive force in the magnetic layer inasmuch as orientation in the magnetic layer is changed.

The magnetic material may be further composed of Mo. When the magnetic material is composed of Co, Pt, and Mo, the coercive force increases on the basis of a pinning effect of a magnetic wall and by promoting a magnetic isolation of magnetic particles. Furthermore, the coercive force also increases by micronizing the magnetic particles. When the coercive force increases, a peak width becomes small in reproduction. As a result, a media noise decreases. In addition, a width of a zigzag wall decreases by increasing a pinning number when the magnetic material is further composed of Mo. As a result, the media noise also decreases.

When both of the intermediate and the magnetic layers include Mo, Mo is easily diffused on a boundary face of the intermediate layer and the magnetic layer. As a result, the magnetic isolation of magnetic particles is further promoted. In addition, it is possible to increase bond strength between the intermediate layer and the magnetic layer.

The magnetic material may be further composed of at least one element selected from the group consisting of tantalum, boron, chromium, oxygen, nitrogen, niobium, manganese, zinc, wolfram, plumbum, rhenium, vanadium, and zirconium.

The intermediate material may be further composed of at least one element selected from the group consisting of wolfram, boron, vanadium, niobium, tantalum, iron, nickel, rhenium, copper, zirconium, zinc, phosphorus, silicon, gallium, germanium, hafnium, aluminum, and titanium. When the intermediate layer includes an additional element or additional elements in addition to Cr and Mo, the additional element is not easily solved to Cr or Mo in the intermediate layer. As a result, promotion occurs in micronization of crystal particles and isolation of crystal particles inasmuch as the additional element segregates on a grain boundaries of the crystal particles in the intermediate layer. Accordingly, promotion occurs in micronization and magnetic isolation of crystal particles so that the coercive force increases and the media noise decreases.

According to a second aspect of this invention, there is provided a magnetic recording medium comprising a non-magnetic substrate having a principal surface, a first intermediate layer formed on the principal surface, a second intermediate layer formed on the first intermediate layer, and a magnetic layer formed on the second intermediate layer. The first intermediate layer comprises a first intermediate material composed of chromium. The second intermediate layer comprises a second intermediate material composed of chromium and molybdenum. The magnetic layer comprises a magnetic material composed of cobalt and platinum.

In the second aspect of this invention, it is possible to homogenize the number of crystal particles in the second intermediate layer and to homogenize the number of crystal particles in the magnetic intermediate layer. As a result, it is possible to decrease the media noise and to improve the magnetic characteristic.

DESCRIPTION OF THE PREFERRED EMBODIMENTS

Figure 1:
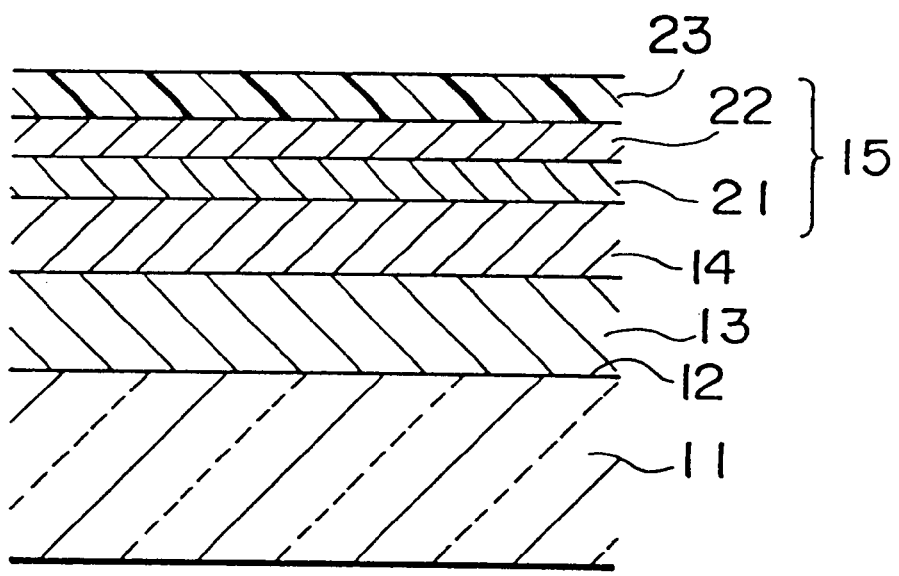
FIG. 1 shows a side view, partially in section, of a magnetic recording medium according to an embodiment of this invention.

Referring to FIG. 1, a magnetic recording medium according to a first embodiment of this invention comprises a non-magnetic substrate 11 which has a principal surface 12 directed upwards in FIG. 1, an intermediate layer 13 on the principal surface 12, and a magnetic layer 14 on the intermediate layer 13. In the example being illustrated, the non-magnetic substrate 11 is composed of a soda-lime glass. The intermediate layer 13 has a thickness of 1000 angstroms and is composed of CrMo. The intermediate layer 13 may be called a backing layer. The magnetic layer 14 has a thickness of 400 angstroms and is composed of CoPt.

On manufacturing the magnetic recording medium illustrated in FIG. 1, the non-magnetic substrate 11 is prepared which is formed as a disk shaped soda-lime plate having a diameter of 65 millimeters and a thickness of 0.9 millimeters. The non-magnetic substrate 11 has a front surface and a rear surface which are directed upwards and downwards in FIG. 1, respectively.

The non-magnetic substrate 11 is introduced into a sputtering apparatus of a radio frequency magnetion type (not shown). The pressure in the sputtering apparatus is reduced to a pressure lower than $5 \times 10^{-7}$ Torrs. An argon gas is introduced as a sputtering gas into the sputtering apparatus at a gas pressure of 10 milli Torrs. In addition, the non-magnetic substrate 11 is kept at a room temperature.

By the use of a target of $Cr_{80}Mo_{20}$ in atomic percents, the intermediate layer 13 is deposited on the principal surface 12 to the thickness of 1000 angstroms when an electric power is supplied to the $Cr_{80}Mo_{20}$ target at an electric power density of 2.5 W/cm$^1$.

After deposition of the intermediate layer 13, the magnetic layer 14 of $Co_{82}Pt_{18}$ is deposited on the intermediate layer 13 by the use of a target of $Co_{82} Pt_{18}$ and the argon gas to the thickness of 400 angstroms within the sputtering apparatus.

A protection layer 15 is formed on the magnetic layer 14 to protect the magnetic layer from erosion or destruction. In the illustrated example, it is noted that the protection layer 15 comprises a first protection film 21 on the magnetic layer 14 and a second protection film 22 formed on the first protection film 21 in a manner to be presently described. Specifically., $Cr_{80}Mo_{20}$ is used as the first protection film 21 in the illustrated example. The first protection film 21 of $Cr_{80}Mo_{20}$ is deposited within the sputtering apparatus by the use of the $Cr_{80}Mo_{20}$ target and the argon gas to a thickness of 50 angstroms. Similarly, a carbon is used as the second protection film 22. The second protection film 22 of the carbon is deposited within the sputtering apparatus by the use of a carbon target and the argon gas to a thickness of 400 angstroms.

On the second protection film 22, a lubricant layer 23 is formed by a lubricant which may be composed of perfluoro polyether. The lubricant layer 23 has a thickness of 20 angstroms. Thus, the magnetic recording medium according to the first embodiment is manufactured through the above-mentioned steps and will be called a first disk.

In a similar manner described in the first disk, second through tenth disks are manufactured except that each of the second through the tenth disks has a composition of the intermediate layer different from the first disk. More particularly, the composition of the intermediate layer 13 is generally represented by $Cr_{100-x}Mo_x$ in the atomic percents, where x represents a number between 0 and 100. In the second disk, the number x represents zero. In the third disk, the number x represents ten. In the fourth disk, the number x represents thirty. In the fifth disk, the number x represents forty. In the sixth disk, the number x represents fifty. In the seventh disk, the number x represents sixty. In the eighth disk, the number x represents seventy. In the ninth disk, the number x represents eighty. In the tenth disk, the number x represents ninety.

First through tenth disc shaped samples are prepared by cutting out the first through the tenth disks, respectively. Each of the first through the tenth disc shaped samples has a diameter of 8 millimeters. By a vibrating type magnetometer, the coercive forces of the first through the tenth disc shaped samples have been measured as first through tenth coercive forces, respectively, on applying a maximum magnetic field of 12 kilo oersteds that is directed towards a direction parallel to a layer surface. As a result of measurement of the first through the tenth coercive forces, it has been found that each of the first through the tenth coercive forces is shown in FIG. 2 as depicted at a double circle.

Figure 2:
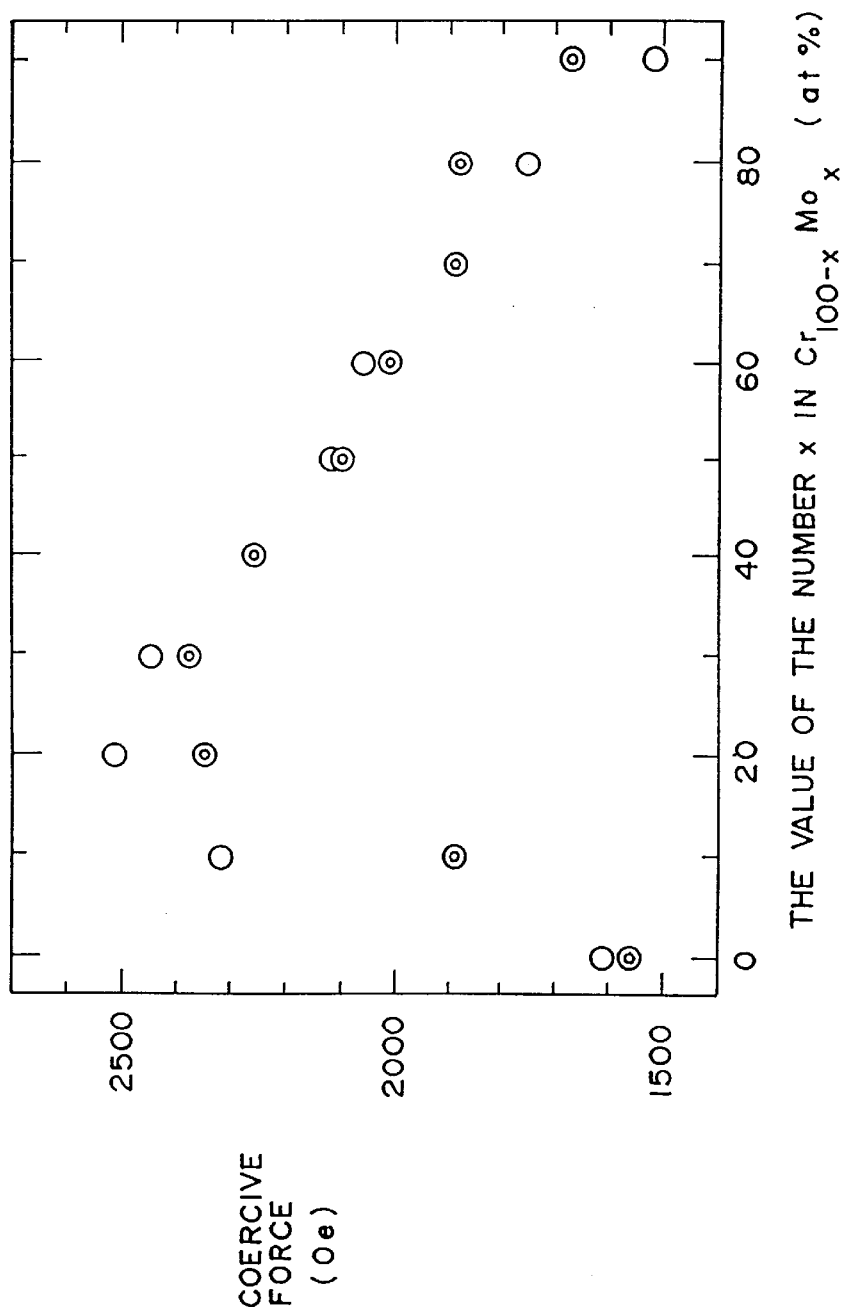
FIG. 2 is an example of a graphical representation for use in describing a coercive force of the magnetic recording medium illustrated in FIG. 1 on changing Mo in an intermediate layer.

As easily understood from FIG. 2, each of the first through the tenth disc shaped samples has a high coercive force greater than 1500 oersteds. Namely, when the magnetic layer 14 is composed of CoPt and the intermediate layer 13 is composed of CrMo, it is noted that the magnetic recording medium has a high coercive force. Particularly, when the number x is between ten and eighty in the composition of the intermediate layer, it is noted that the magnetic recording medium has a further high coercive force.

In a similar manner described in the first disk, an 11th disk is manufactured except that the 11th disk has a composition of the magnetic layer different from the first disk. More specifically, the magnetic layer of the 11th disk is composed of $Co_{74}Pt_{18}Mo_8$. Similarly, 12th through 20th disks are manufactured in manners corresponding to the second through the tenth disks, respectively, except that the magnetic layer is composed of $Co_{74}Pt_{18}Mo_8$ in each of the 12th through 20th disks.

11th through 20th disc shaped samples are prepared by cutting out the 11th through the 20th disks, respectively. Each of the 11th through the 20th disc shaped samples has a diameter of 8 millimeters. By the vibrating type magnetometer, the coercive forces of the 11th through the 20th disc shaped samples have been measured as 11th through 20th coercive forces, respectively, on applying the maximum magnetic field of 12 kilo oersteds that is directed towards the direction parallel to the layer surface. As a result of measurement of the 11th through the 20th coercive forces, it has been found that each of the 11th through the 20th coercive forces is shown in FIG. 2 as depicted at a single circle.

As easily understood from FIG. 2, each of the 11th through the 20th disc shaped samples has a high coercive force greater than 1500 oersteds. Namely, when the magnetic layer is composed of CoPtMo and the intermediate layer is composed of CrMo, it is noted that the magnetic recording medium has a high coercive force. Particularly, when the number x is variable between ten and eighty in the composition of the intermediate layer, it is noted that the magnetic recording medium has a further high coercive force.

Next, description will be made as regards a magnetic recording medium having the intermediate layer composed of CrMoZr and the magnetic layer composed of CoPtMo.

In the similar manner described in the 11th disk, 21st through 32nd disks are manufactured except that each of the 21st through 32nd disks has a composition of the intermediate layer different from the 11th disk. The intermediate layer is composed of $Cr_{100-y-z}Mo_zZr_y$ in the atomic percents in each of the 21st through 32nd disks, where y is a number between one and one hundred, z is a number between one and one hundred. More specifically, the intermediate layer includes Mo of 9 atomic percents in each of the 21st through 32nd disks. Namely, the number y is nine in each of the 21st through 32nd disks. In addition, the intermediate layer includes Zr of which the amount is different from one another in the 21st through 32nd disks. For example, the amount of Zr is changed between zero atomic percents and fifty atomic percents.

Similarly, 33rd through 44th disks are manufactured so that the intermediate layer includes Mo of 18 atomic percents and the amount of Zr different from one another between zero atomic percents and fifty atomic percents in the 33rd through the 44th disks.

The 21st through 32nd disc shaped samples are prepared by cutting out the 21st through the 32nd disks, respectively. Each of the 21st through the 32nd disk shaped samples has a diameter of 8 millimeters. Similarly, 33rd through 44th disc shaped samples are prepared by cutting out the 33rd through the 44th disks, respectively. Each of the 33rd through the 44th disc shaped samples has a diameter of 8 millimeters.

Figure 3:
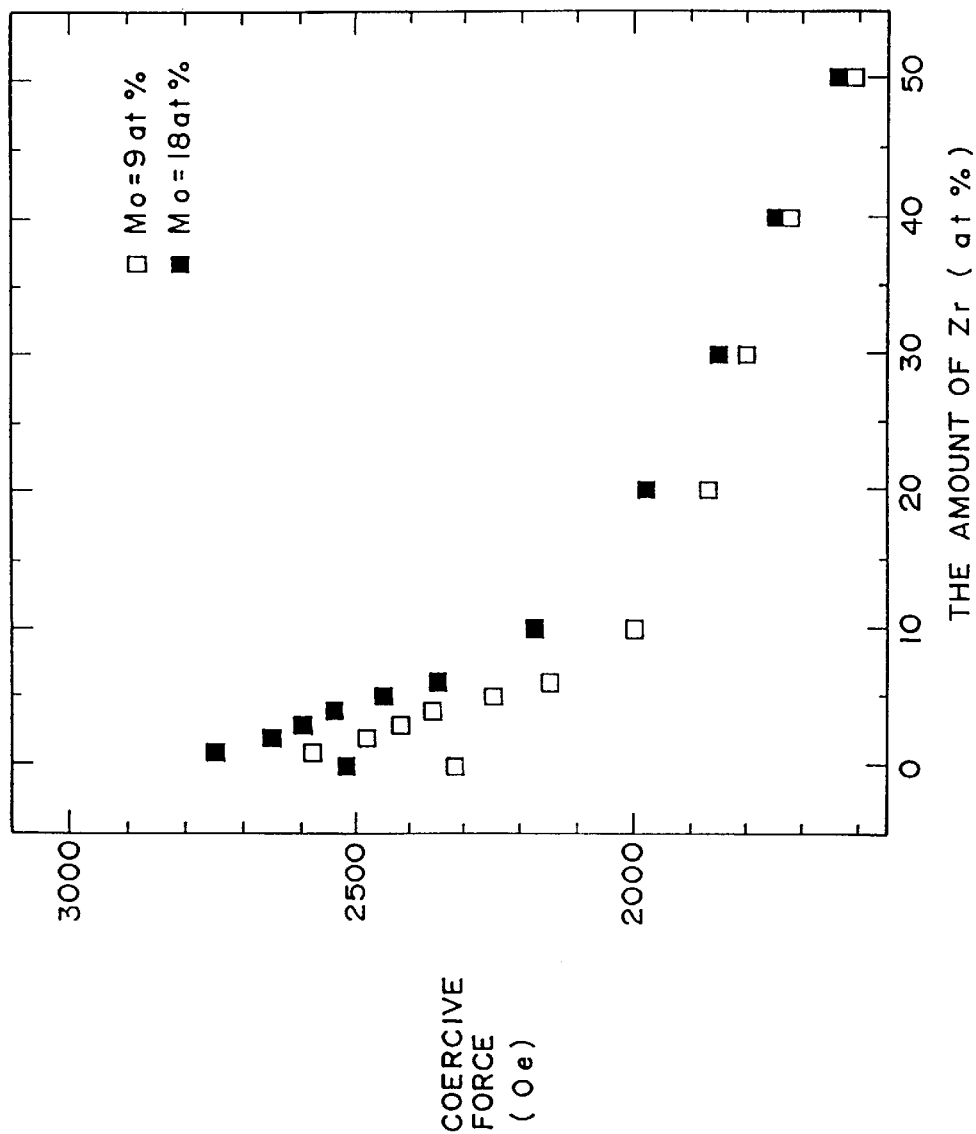
FIG. 3 is another example of a graphical representation for use in describing a coercive force of the magnetic recording medium illustrated in FIG. 1 on changing Zr in an intermediate layer when the amount of Mo is 9 atomic percents and when the amount of Mo is 18 atomic percents.

By the vibrating type magnetometer, the coercive forces of the 21st through the 32nd and the 33rd through the 44th disc shaped samples have been measured as 21st through 32nd and 33rd through 44th coercive forces, respectively, on applying the maximum magnetic field of 12 kilo oersteds that is directed towards the direction parallel to the layer surface. As a result of measurement of the 21st through the 32nd and the 33rd through the 44th coercive forces, it has been found that each of the 21st through the 32nd and the 33rd through the 44th coercive forces is shown in FIG. 3. In FIG. 3, each of the 21st through the 32nd coercive forces is depicted at a white mark. Each of the 33rd through the 44th coercive forces is depicted by a black mark.

As easily understood from FIG. 3, the magnetic recording medium has a high coercive force when the intermediate layer is composed of CrMoZr. When the intermediate layer includes Zr between 0.1 atomic percents and 30 atomic percents, the magnetic recording medium has a further coercive force. Particularly, it is noted that the magnetic recording medium has the coercive force greater than that of the magnetic recording medium having the intermediate layer composed of CoMo when the intermediate layer includes Zr between 0.1 atomic percent and 4 atomic percent.

In the 11th disc shaped sample comprising the intermediate layer composed of $Cr_{80}Mo_{20}$ and the magnetic layer composed of $Co_{74}Pt_{17}Mo_8$, the product (Mr·δ) of remanence and thickness of the magnetic layer has been measured and an output level of reproduction has been measured. In the 34th disc shaped sample comprising the intermediate layer composed of $Cr_{80}Mo_{18}Zr_2$ and the magnetic layer composed of $Co_{74}Pt_{18}Mo_8$, the product (Mr·δ) of remanence and thickness of the magnetic layer has been measured and an output level of reproduction has been measured.

For comparison, a disc shaped sample is manufactured as a comparison sample in a manner similar to the 11th disc shaped sample except that the comparison sample comprises the intermediate layer composed of Cr. The coercive force, the product of remanence and thickness of the magnetic layer, and the output level of reproduction have been measured in the comparison sample.

The results of the above-mentioned measurements are shown in Table 1. On measuring the output levels of the 11th, the 34th, and comparison samples, a film type magnetic head is used which has a coil of a turn number of 50, a track width of 6 μm, and a gap length of 0.25 μm. When a relative speed is kept at 6 meters/sec between the film type magnetic head and each of the 11th, the 34th, the comparison samples and a flying height is kept at 0.055 μm between the film type magnetic head and each of the 11th, the 34th, the comparison samples, the output level of reproduction has been measured at a track recording density of 80 kfci, where 80 kfci represents the track recording density of 80000 bits/inch.

As readily understood from Table 1, the output level of the 11th sample is much higher than that of the comparison sample inasmuch as the 11th sample comprises the intermediate layer composed of CrMo. Similarly, the output level of the 34th sample is much higher than that of the comparison sample inasmuch as the 34th sample comprises the intermediate layer composed of CrMoZr.

TABLE 1

| | INTERMEDIATE LAYER | MAGNETIC LAYER | OUTPUT LEVEL OF REPRODUCTION ($\mu$V) | Hc (Oe) | Mr · $\delta$ (emu/cm$^2$) |
|---|---|---|---|---|---|
| 11th sample | $Cr_{80}Mo_{20}$ | $Co_{74}Pt_{18}Mo_8$ | 220 | 2520 | $2.1 \times 10^{-3}$ |
| 34th sample | $Cr_{80}Mo_{18}Zr_2$ | $Co_{74}Pt_{18}Mo_8$ | 235 | 2650 | $2.3 \times 10^{-3}$ |
| comparison sample | Cr | $Co_{74}Pt_{18}Mo_8$ | 165 | 1610 | $2.1 \times 10^{-3}$ |

In order to carry out an anti-corrosion test, each of the first and the 11th samples is introduced into a thermostat and humidistat chamber. Each of the first and the 11th samples is kept at the temperature of 80° C. and the humidity of 80%. Each of the first and the 11th samples is taken out from the thermostat and humidistat chamber every predetermined hours. A saturation magnetization has been measured in each of the first and the 11th samples. The measurement of the saturation magnetization is carried out until 1000 hours lapse after the anti-corrosion test starts.

Figure 4:
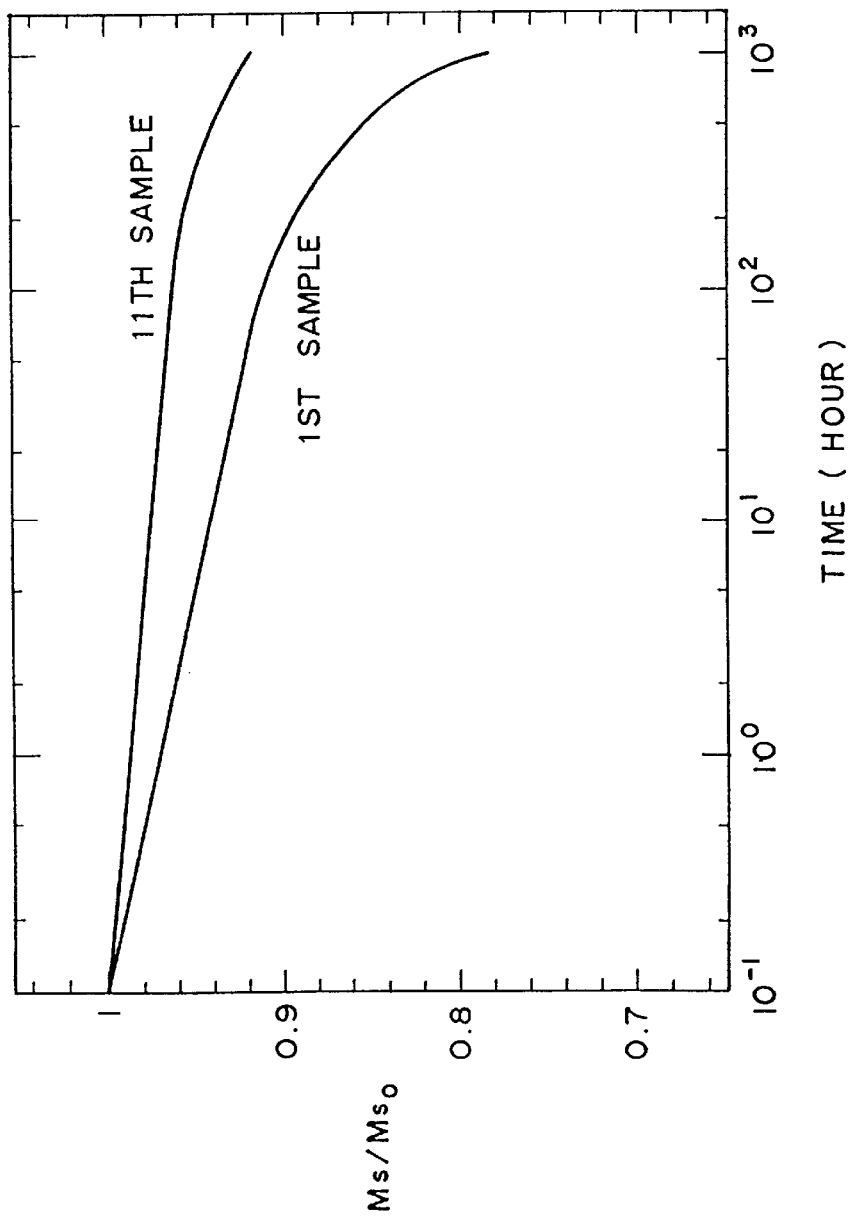
FIG. 4 is a graphical representation for use in describing a relationship of a saturation magnetization and a test time duration in an anti-corrosion test.

A result of measurement of the saturation magnetization is shown in FIG. 4. In FIG. 4, an axis of abscissas is an axis of a time which is for use in representing a time of the anti-corrosion test. An axis of ordinates is an axis of normalized values each of which is obtained by normalizing a measured saturation magnetization (Ms) divided by a saturation magnetization (ms$_0$) before the anti-corrosion test.

As readily understood from FIG. 4, each of the first and the 11th samples has a high corrosion resistance. Particularly, it is understood that the corrosion resistance is strikingly developed when the magnetic layer is composed of CoPtMo.

By the use of a spectrum analyzer, a noise spectrum has been measured as a media noise (Nm) in each of the first, the 11th, and the 34th samples at a carrier frequency of 9.4 MHz and a frequency band of 15 MHz on reproduction of information. As a result of measurement of the media noise, the media noise has been measured in the first sample as 7.58 $\mu$Vrms. Otherwise, the media noise has been measured in the 11th sample as 5.08 $\mu$Vrms. It has been found that the media noise decreases when the magnetic layer is composed of CoPtMo. In addition, the media noise has been measured in the 34th sample as 4.85 $\mu$Vrms. It has been found that the media noise further decreases when the magnetic layer is composed of CoPtMo and the intermediate layer is composed of CrMoZr.

In a manner similar to the first disk, the disc shaped substrate is prepared which is formed as the soda-lime plate having a diameter of 65 millimeters and a thickness of 0.9 millimeters. The substrate is introduced into the sputtering apparatus to deposit the intermediate layer of $Cr_{80}Mo_{20}$ by the use of the target of $Cr_{80}Mo_{20}$ to a thickness of 1500 angstroms. Subsequently, the magnetic layer of $Co_{70}Pt_{18}Mo_{12}$ is deposited on the intermediate layer to the thickness of 400 angstroms within the sputtering apparatus. In this case, sputtering is carried out by the use of the target of $Co_{70}Pt_{18}Mo_{12}$. The protection layer of $SiO_2$ is formed on the magnetic layer to the thickness of 50 angstroms. Thus, a 45th disk is manufactured through the above-mentioned steps.

The coercive force and the product of remanence and the thickness of the magnetic layer has been measured in the 45th disk. Table 2 shows a result of measurement of the coercive force and the product in the 45th disk.

In a similar manner described in the 45th disk, 46th through 51th disks are manufactured each of which comprises the intermediate layer, the magnetic layer, and the protection layer each of which has the composition shown in Table 2. In each of the 46th through the 51th disks, the coercive force and the product of remanence and the thickness of the magnetic layer has been measured.

As readily understood from Table 2, it has been found that the coercive force and the product are very high when the intermediate layers composed of CrMo and the magnetic layer is composed of CoPtMo including Mo up to 30 atomic as a maximum amount.

TABLE 2

| | INTERMEDIATE LAYER | MAGNETIC LAYER | PROTECTION LAYER | Hc (Oe) | Mr · $\delta$ (emu/cm$^2$) |
|---|---|---|---|---|---|
| 45th disk | $Cr_{80}Mo_{20}$ | $Co_{70}Pt_{18}Mo_{12}$ | $SiO_2$ | 2400 | $2.1 \times 10^{-3}$ |
| 46th disk | $Cr_{80}Mo_{20}$ | $Co_{69}Pt_{30}Mo_1$ | C | 2250 | $2.0 \times 10^{-3}$ |
| 47th disk | $Cr_{80}Mo_{20}$ | $Co_{76}Pt_{16}Mo_8$ | $ZrO_2$ | 2160 | $2.4 \times 10^{-3}$ |
| 48th disk | $Cr_{80}Mo_{20}$ | $Co_{67}Pt_{17}Mo_{16}$ | $Cr_{80}Mo_{20}$ | 2370 | $2.0 \times 10^{-3}$ |
| 49th disk | $Cr_{80}Mo_{20}$ | $Co_{75}Pt_5Mo_{20}$ | BN | 1880 | $2.6 \times 10^{-3}$ |
| 50th disk | $Cr_{80}Mo_{20}$ | $Co_{65}Pt_{10}Mo_{25}$ | C | 1820 | $1.8 \times 10^{-3}$ |
| 51st disk | $Cr_{80}Mo_{20}$ | $Co_{50}Pt_{20}Mo_{30}$ | $SiO_2$ | 1790 | $1.5 \times 10^{-3}$ |

Hc: coercive force
Mr · $\delta$: product of remanence and thickness of magnetic layer Next, the non-magnetic substrate is prepared which is formed as a disk shaped soda-lime plate having a diameter of 65 millimeters and a thickness of 0.9 millimeters. The non-magnetic substrate is introduced into a sputtering apparatus of a direct current magnetron type. The pressure in the sputtering apparatus is reduced to a pressure lower than $8 \times 10^{-7}$ Torrs. The argon gas is introduced as the sputtering gas into the sputtering apparatus at a gas pressure of 15 milli Torrs. In addition, the non-magnetic substrate is kept at a temperature of 100° C.

By the use of the target of $Cr_{70}Mo_{30}$ in the atomic percents, the intermediate layer is deposited on the non-magnetic substrate to a thickness of 2000 ang-stroms when the electric power is supplied to the $Cr_{70}Mo_{30}$ target at the electric power density of 18 W/cm².

After deposition of the intermediate layer, the magnetic layer of $Co_{68}Pt_{17}Mo_{15}$ is deposited on the intermediate layer by the use of the target $Co_{68}Pt_{17}Mo_{15}$ and the argon gas to the thickness of 350 angstroms within the sputtering apparatus.

A protection film of $Cr_{70}Mo_{30}$ is formed on the magnetic layer by the use of the target of $Cr_{70}Mo_{30}$ and the argon gas to the thickness of 80 angstroms. Subsequently, a protection layer of $SiO_2$ is formed on the protection film to the thickness of 150 angstroms. Thus, the magnetic recording medium according to the first embodiment is manufactured through the above-mentioned steps and will be called a 52th disk.

In a manner similar to the 52th disk, 53th through 56th disks are manufactured except that the non-magnetic substrate is kept in each of the 53th through the 56th disks at a temperature different from the 52nd disk on manufacturing. More specifically, the non-magnetic substrate is kept at a temperature of 200° C. in the 53rd disk. The non-magnetic substrate is kept at a temperature of 250° C. in the 54th disk. The non-magnetic substrate is kept at a temperature of 300° C. in the 55th disk. The non-magnetic substrate is kept at a temperature of 400° C. in the 56th disk.

In each of the 52th through the 56th disks, the coercive force and the product of remanence and the thickness of the magnetic layer has been measured. The results of measurement of the coercive force and the product of remanence and the thickness of the magnetic layer are shown in Table 3.

TABLE 3

|  | TEMPERATURE OF SUBSTRATE (° C.) | Hc (Oe) | Mr · δ (emu/cm²) |
|---|---|---|---|
| 52nd disk | 100 | 2450 | $1.6 \times 10^{-3}$ |
| 53rd disk | 200 | 2400 | $1.7 \times 10^{-3}$ |
| 54th disk | 250 | 2170 | $1.8 \times 10^{-3}$ |
| 55th disk | 300 | 2050 | $1.6 \times 10^{-3}$ |
| 56th disk | 400 | 1860 | $1.4 \times 10^{-3}$ |

Hc: coercive force
Mr · δ: product of remanence and thickness of magnetic layer

As readily understood from Table 3, it has been found that the magnetic characteristic does not become poor even if the non-magnetic substrate is kept at the temperature of 400° C. on manufacturing.

In a manner similar to the first disk, 57th through 76th disks are manufactured each of which has the intermediate layer, the magnetic layer, and the protection layer each of which has the composition and the layer thickness shown in Table 4.

TABLE 4-I

|  | INTERMEDIATE LAYER (LAYER THICKNESS) | MAGNETIC LAYER (LAYER THICKNESS) | PROTECTION LAYER (LAYER THICKNESS) | Hc (Oe) | Mr · δ (emu/cm²) |
|---|---|---|---|---|---|
| 57th disk | $Cr_{75}Mo_{20}W_5$ (500Å) | $Co_{64}Pt_{16}Mo_{20}$ (300Å) | SiC (150Å) | 2320 | $1.7 \times 10^{-3}$ |
| 58th disk | $Cr_{80}Mo_{15}V_5$ (1000Å) | $Co_{56}Pt_{14}Mo_{30}$ (300Å) | $Si_3N_4$ (150Å) | 2090 | $1.9 \times 10^{-3}$ |
| 59th disk | $Cr_{80}Mo_{16}W_4$ (800Å) | $Co_{67}Pt_{17}Mo_{16}$ (300Å) | $SiO_2$ (150Å) | 2300 | $1.8 \times 10^{-3}$ |
| 60th disk | $Cr_{90}Mo_8Nb_2$ (1500Å) | $Co_{67}Pt_{17}Mo_{16}$ (300Å) | C (250Å) | 1960 | $1.9 \times 10^{-3}$ |
| 61st disk | $Cr_{75}Mo_{20}Ta_5$ (1500Å) | $Co_{67}Pt_{17}Mo_{16}$ (300Å) | $ZrO_2$ (100Å) | 2180 | $1.9 \times 10^{-3}$ |
| 62nd disk | $Cr_{85}Mo_8Fe_7$ (2500Å) | $Co_{67}Pt_{17}Mo_{16}$ (300Å) | BN (150Å) | 1920 | $2.0 \times 10^{-3}$ |
| 63rd disk | $Cr_{78}Mo_{20}Ni_2$ (3500Å) | $Co_{67}Pt_{17}Mo_{16}$ (300Å) | C (300Å) | 2240 | $1.9 \times 10^{-3}$ |
| 64th disk | $Cr_{80}Mo_{10}W_5Re_5$ (1200Å) | $Co_{67}Pt_{17}Mo_{16}$ (350Å) | $SiO_2$ (100Å) | 2130 | $1.9 \times 10^{-3}$ |
| 65th disk | $Cr_{78}Mo_{10}W_7Ta_5$ (1800Å) | $Co_{67}Pt_{17}Mo_{16}$ (350Å) | C (150Å) | 2080 | $2.0 \times 10^{-3}$ |

TABLE 4-II

|  | INTERMEDIATE LAYER (LAYER THICKNESS) | MAGNETIC LAYER (LAYER THICKNESS) | PROTECTION LAYER (LAYER THICKNESS) | Hc (Oe) | Mr · δ (emu/cm²) |
|---|---|---|---|---|---|
| 66th disk | $Cr_{77}Mo_{18}Cu_5$ (2000Å) | $Co_{67}Pt_{17}Mo_{16}$ (400Å) | $SiO_2$ (150Å) | 2400 | $2.0 \times 10^{-3}$ |
| 67th disk | $Cr_{88}Mo_9Zn_3$ (2000Å) | $Co_{67}Pt_{17}Mo_{16}$ (400Å) | $SiO_2$ (150Å) | 2450 | $2.3 \times 10^{-3}$ |
| 68th disk | $Cr_{88}Mo_9P_3$ (1300Å) | $Co_{67}Pt_{17}Mo_{16}$ (400Å) | C (300Å) | 2240 | $1.9 \times 10^{-3}$ |

TABLE 4-II-continued

| | INTERMEDIATE LAYER (LAYER THICKNESS) | MAGNETIC LAYER (LAYER THICKNESS) | PROTECTION LAYER (LAYER THICKNESS) | Hc (Oe) | Mr · δ (emu/cm$^2$) |
|---|---|---|---|---|---|
| 69th disk | $Cr_{85}Mo_{12}Si_3$ (1800Å) | $Co_{67}Pt_{17}Mo_{16}$ (400Å) | C (300Å) | 2250 | $1.9 \times 10^{-3}$ |
| 70th disk | $Cr_{80}Mo_{15}Ga_5$ (2500Å) | $Co_{67}Pt_{17}Mo_{16}$ (300Å) | SiC (150Å) | 2120 | $1.7 \times 10^{-3}$ |
| 71st disk | $Cr_{84}Mo_{12}Ge_4$ (3000Å) | $Co_{67}Pt_{17}Mo_{16}$ (300Å) | BN (150Å) | 2050 | $1.7 \times 10^{-3}$ |
| 72nd disk | $Cr_{89}Mo_9Hf_2$ (1200Å) | $Co_{67}Pt_{17}Mo_{16}$ (300Å) | C (300Å) | 2080 | $1.8 \times 10^{-3}$ |
| 73rd disk | $Cr_{87}Mo_{10}Al_3$ (1000Å) | $Co_{67}Pt_{17}Mo_{16}$ (300Å) | $Si_3N_4$ (150Å) | 2020 | $1.7 \times 10^{-3}$ |
| 74th disk | $Cr_{86}Mo_9Ti_5$ (1000Å) | $Co_{67}Pt_{17}Mo_{16}$ (300Å) | $ZrO_2$ (100Å) | 2150 | $1.8 \times 10^{-3}$ |
| 75th disk | $Cr_{86}Mo_9Zr_2Nb_3$ (1500Å) | $Co_{67}Pt_{17}Mo_{16}$ (400Å) | $SiO_2$ (150Å) | 2380 | $2.3 \times 10^{-3}$ |
| 76th disk | $Cr_{86}Mo_9Zr_2Ta_3$ (1500Å) | $Co_{67}Pt_{17}Mo_{16}$ (400Å) | $ZrO_2$ (100Å) | 2370 | $2.3 \times 10^{-3}$ |

Hc: coercive force
Mr · δ: product of remanence and thickness of magnetic layer

In each of the 57th through the 76th disks, the coercive force and the product of remanence and the thickness of the magnetic layer has been measured. Results of measurement of the coercive force and the product of remanence and the thickness of the magnetic layer are shown in Table 4. As readily understood from Table 4, it has been found that the coercive force and the product of remanence and the thickness of the magnetic layer are high even when the intermediate layer is composed of CrMo and a particular element or elements except Zr.

In a manner similar to the 45th disk, 77th through 102nd disks are manufactured each of which has the intermediate layer, the magnetic layer, and the protection layer each of which has the composition shown in Table 5. In each of the 77th through 102nd disks, the intermediate layer has the thickness of 2000 angstroms. The magnetic layer has the thickness of 450 angstroms. The protection layer has the thickness of 150 angstroms.

In each of the 77th through the 102nd disks, the coercive force and the product of remanence and the thickness of the magnetic layer has been measured. Results of measurement of the coercive force and the product of remanence and the thickness of the magnetic layer are shown in Table 5.

As readily understood from Table 5, it has been found that the coercive force and the product of remanence and the thickness of the magnetic layer are high even when the magnetic layer is composed of CoPtMo and a specific element or elements shown in Table 5.

TABLE 5-I

| | INTERMEDIATE LAYER | MAGNETIC LAYER | PROTECTION LAYER | Hc (Oe) | Mr · δ (emu/cm$^2$) |
|---|---|---|---|---|---|
| 77th disk | $Cr_{82}Mo_{18}$ | $Co_{70}Pt_{15}Mo_{10}B_5$ | $SiO_2$ | 2000 | $2.2 \times 10^{-3}$ |
| 78th disk | $Cr_{82}Mo_{18}$ | $Co_{70}Pt_{15}Mo_{10}Ta_5$ | $SiO_2$ | 1950 | $2.3 \times 10^{-3}$ |
| 79th disk | $Cr_{82}Mo_{18}$ | $Co_{68}Pt_{17}Mo_{12}Mn_3$ | SiC | 2350 | $2.1 \times 10^{-3}$ |
| 80th disk | $Cr_{82}Mo_{18}$ | $Co_{64}Pt_{13}Mo_{15}Cr_8$ | C | 2240 | $1.9 \times 10^{-3}$ |
| 81th disk | $Cr_{82}Mo_{18}$ | $Co_{72}Pt_{12}Mo_{11}O_5$ | $ZrO_2$ | 1890 | $2.0 \times 10^{-3}$ |
| 82th disk | $Cr_{82}Mo_{18}$ | $Co_{77}Pt_8Mo_{10}N_5$ | $Cr_{80}Mo_{20}$ | 1760 | $2.5 \times 10^{-3}$ |
| 83th disk | $Cr_{82}Mo_{18}$ | $Co_{75}Pt_{15}Mo_7Nb_3$ | BN | 2040 | $2.5 \times 10^{-3}$ |
| 84th disk | $Cr_{82}Mo_{18}$ | $Co_{78}Pt_{10}Mo_6W_6$ | C | 1970 | $2.6 \times 10^{-3}$ |
| 85th disk | $Cr_{82}Mo_{18}$ | $Co_{69}Pt_{19}Mo_{10}Zn_2$ | $Si_3N_4$ | 2280 | $2.1 \times 10^{-3}$ |
| 86th disk | $Cr_{82}Mo_{18}$ | $Co_{63}Pt_{12}Mo_{15}Pb_{10}$ | $ZrO_2$ | 2170 | $1.7 \times 10^{-3}$ |
| 87th disk | $Cr_{82}Mo_{18}$ | $Co_{70}Pt_{14}Mo_8Re_8$ | $Cr_{80}Mo_{20}$ | 2020 | $2.1 \times 10^{-3}$ |

TABLE 5-II

| | INTERMEDIATE LAYER | MAGNETIC LAYER | PROTECTION LAYER | Hc (Oe) | Mr · δ (emu/cm$^2$) |
|---|---|---|---|---|---|
| 88th disk | $Cr_{82}Mo_{18}$ | $Co_{70}Pt_{15}Mo_{10}V_5$ | C | 2000 | $2.5 \times 10^{-3}$ |
| 89th disk | $Cr_{82}Mo_{18}$ | $Co_{75}Pt_{15}Mo_7Zr_3$ | $SiO_2$ | 2060 | $2.5 \times 10^{-3}$ |
| 90th disk | $Cr_{79}Mo_{18}Zr_3$ | $Co_{70}Pt_{15}Mo_{10}B_5$ | $SiO_2$ | 1950 | $2.4 \times 10^{-3}$ |
| 91st disk | $Cr_{79}Mo_{18}Zr_3$ | $Co_{70}Pt_{15}Mo_{10}Ta_5$ | $SiO_2$ | 2050 | $2.4 \times 10^{-3}$ |
| 92nd disk | $Cr_{79}Mo_{18}Zr_3$ | $Co_{68}Pt_{17}Mo_{12}Mn_3$ | SiC | 2200 | $2.2 \times 10^{-3}$ |
| 93rd disk | $Cr_{79}Mo_{18}Zr_3$ | $Co_{64}Pt_{13}Mo_{15}Cr_8$ | C | 2300 | $2.1 \times 10^{-3}$ |

TABLE 5-II-continued

| | INTERMEDIATE LAYER | MAGNETIC LAYER | PROTECTION LAYER | Hc (Oe) | Mr · δ (emu/cm$^2$) |
|---|---|---|---|---|---|
| 94th disk | $Cr_{79}Mo_{18}Zr_3$ | $Co_{72}Pt_{12}Mo_{11}O_5$ | $ZrO_2$ | 1820 | $2.0 \times 10^{-3}$ |
| 95th disk | $Cr_{79}Mo_{18}Zr_3$ | $Co_{77}Pt_8Mo_{10}N_5$ | $Cr_{20}Mo_{80}$ | 1750 | $2.5 \times 10^{-3}$ |
| 96th disk | $Cr_{79}Mo_{18}Zr_3$ | $Co_{75}Pt_{15}Mo_7Nb_3$ | BN | 1980 | $2.7 \times 10^{-3}$ |
| 97th disk | $Cr_{79}Mo_{18}Zr_3$ | $Co_{78}Pt_{10}Mo_6W_6$ | C | 2050 | $2.6 \times 10^{-3}$ |
| 98th disk | $Cr_{79}Mo_{18}Zr_3$ | $Co_{69}Pt_{19}Mo_{10}Zn_2$ | $Si_3N_4$ | 2280 | $2.4 \times 10^{-3}$ |
| 99th disk | $Cr_{79}Mo_{18}Zr_3$ | $Co_{63}Pt_{12}Mo_{15}Pb_{10}$ | $ZrO_2$ | 2060 | $1.7 \times 10^{-3}$ |
| 100th disk | $Cr_{79}Mo_{18}Zr_3$ | $Co_{63}Pt_{14}Mo_{15}Re_8$ | $Cr_{20}Mo_{80}$ | 1950 | $2.1 \times 10^{-3}$ |
| 101st disk | $Cr_{79}Mo_{18}Zr_3$ | $Co_{70}Pt_{15}Mo_{10}V_5$ | C | 2050 | $2.5 \times 10^{-3}$ |
| 102nd disk | $Cr_{79}Mo_{18}Zr_3$ | $Co_{75}Pt_{15}Mo_7Zr_3$ | $SiO_2$ | 2150 | $2.6 \times 10^{-3}$ |

Hc: coercive force
Mr · δ: product of remanence and thickness of magnetic layer

The non-magnetic substrate is prepared which is formed as a disk shaped soda-lime plate having a diameter of 65 millimeters and a thickness of 0.9 millimeters. The non-magnetic substrate is introduced into a sputtering apparatus of a radio frequency magnetron type. The pressure in the sputtering apparatus is reduced to a pressure lower than $5 \times 10^{-7}$ Torrs. The argon gas is introduced as the sputtering gas into the sputtering apparatus at the gas pressure of 10 milli Torrs. In addition, the non-magnetic substrate is kept at a room temperature.

By the use of a Cr target and a Mo target, the intermediate layer is deposited on the non-magnetic substrate to the thickness of 1500 angstroms. In the deposition of the intermediate layer, the electric power is supplied to the Cr target at the electric power density of 2.5 W/cm$^2$. Similarly, the electric power is supplied to the Mo target with the electric power density being changed from 0.1 W/cm$^2$ to 1.2 W/cm$^2$. As a result, it has been found that the amount of Mo increases in the intermediate layer towards a direction from the non-magnetic substrate upwards.

After deposition of the intermediate layer, the magnetic layer of $Cr_{74}Pt_{18}Mo_8$ is deposited on the intermediate layer by the use of the target of $Cr_{74}Pt_{18}Mo_8$ and the argon gas to the thickness of 400 angstroms within the sputtering apparatus. Subsequently, a Cr layer is formed on the magnetic layer by the use of the argon gas to the thickness of 50 angstroms. A $SiO_2$ layer is formed on the Cr layer by the use of the argon gas to the thickness of 300 angstroms. The Cr layer and the $SiO_2$ layer are collectively used as the protection layer. On the $SiO_2$ layer, the lubricant layer is formed by the lubricant which may be composed of perfluoro polyether. The lubricant layer has the thickness of 20 angstroms. Thus, the magnetic recording medium according to the first embodiment is manufactured through the above-mentioned steps and will be called a 103rd disk.

By the vibrating type magnetometer, the coercive force of the 103rd disk has been measured on applying the maximum magnetic field of 12 kilo oersteds that is directed towards the direction parallel to the layer surface. As a result of measurement of the coercive force, it has been found that the coercive force is 2500 oersteds.

Furthermore, an output level of reproduction has been measured in the 103rd disk. On measuring the output level of reproduction of the 103rd disk, the film type magnetic head is used which has a coil of a turn number of 50, a track width of 6 μm, and a gap length of 0.25 μm. When the relative speed is kept at 6 meters/sec between the film type magnetic head and the 103rd disk and the flying height is kept at 0.055 μm between the film type magnetic head and the 103rd disk, the output level of reproduction has been measured at a track recording density of 80 kfci. As a result, the output level of reproduction has been measured as 225 μV.

By the use of the spectrum analyzer, the noise spectrum has been measured as the media noise (Nm) in the 103rd disk on reproduction of information at the carrier frequency of 9.4 MHz and a frequency band of 15 MHz. As a result of measurement of the media noise, the media noise has been measured in the 103rd disk as 5.15 μVrms.

As readily understood from the above description, it has been found that the magnetic characteristic is improved when the amount of Mo increases in the intermediate layer towards a direction from the non-magnetic substrate upwards.

In a manner similar to the 103rd disk, a 104th disk is manufactured except that the intermediate layer is different from the 103rd disk. More particularly, by the use of a Cr target, a $Cr_{95}Mo_5$ target, a $Cr_{90}Mo_{10}$ target, a $Cr_{85}Mo_{15}$ target, and a $Cr_{08}Mo_{20}$ target, a Cr film, a $Cr_{95}Mo_5$ film, a $Cr_{90}M_{10}$ film, a $Cr_{85}Mo_{15}$ film, and a $Cr_{80}Mo_{20}$ film are deposited on the non-magnetic substrate in the above-mentioned order in the sputtering apparatus of a radio frequency type when the electric power density is 2.5 W/cm$^2$. The Cr film, the $Cr_{95}Mo_5$ film, the $Cu_{90}Mo_{10}$ film, the $Cr_{85}Mo_{15}$ film, and the $Cr_{80}Mo_{20}$ film are collectively used as the intermediate layer having the thickness of 1500 angstroms.

When the above-mentioned films, each of which has a different amount of Mo, are deposited on the non-magnetic substrate in the above-mentioned order, the amount of Mo increases in the intermediate layer towards a direction from the non-magnetic substrate upwards.

In a manner similar to the 103rd disk, the coercive force, the output level of reproduction, and the media noise have been measured in the 104th disk. As the results of measurement, it has been found that the coercive force, the output level of reproduction, and the media noise have been measured at 2550 oersteds, 255 μV, and 5.10 μVrms, respectively.

Thus, it is noted that the magnetic characteristic is improved when the intermediate layer has the films each of which has the different amount of Mo as described above.

In a manner similar to the 103rd disk, a 105th disk is manufactured except that intermediate layer is different from the 103rd disk. More specifically, by the use of a Cr target, a Mo target, and a Zr target, the intermediate layer is deposited on the non-magnetic substrate to the thickness of 1500 angstroms in the sputtering apparatus of a radio frequency type. At that time, the electric power density for the Cr target is 2.5 W/cm$^2$. The electric power density for the Zr target is 0.1 W/cm². The electric power density for the Mo target is successively changed from 0.1 W/cm² to 1.2 W/cm².

As a result, it has been found that the amount of Mo increases in the intermediate layer towards a direction from the non-magnetic substrate upwards.

In a manner similar to the 103rd disk, the coercive force, the output level of reproduction, and the media noise have been measured in the 105th disk. As the results of measurement, it has been found that the coercive force, the output level of reproduction, and the media noise have been measured as 2600 oersteds, 230 µV, and 4.90 µVrms, respectively.

Thus, it is noted that the magnetic characteristic is improved when the amount of Mo increases in the intermediate layer towards a direction from the non-magnetic substrate upwards.

In a manner similar to the 103rd disk, a 106th disk is manufactured except that the intermediate layer is different from the 103rd disk. More particularly, by the use of a Cr target, a $Cr_{95}Mo_3Zr_2$ target, a $Cr_{90}Mo_8Zr_2$ target, a $Cr_{85}Mo_{13}Zr_2$ target, and a $Cr_{80}Mo_{18}Zr_2$ target, a Cr film, a $Cr_{95}Mo_3Zr_2$ film, a $Cr_{90}Mo_8Zr_2$ film, a $Cr_{85}Mo_{13}Zr_2$ film, and a $Cr_{80}Mo_{18}Zr_2$ film are deposited on the non-magnetic substrate in an ascending order in the sputtering apparatus of a radio frequency type when the electric power density is 2.5 W/cm². The Cr film, the $Cr_{95}Mo_3Zr_2$ film, the $Cr_{90}Mo_8Zr_2$ film, the $Cr_{85}Mo_{13}Zr_2$ film, and the $Cr_{80}Mo_{18}Zr_2$ film are collectively used as the intermediate layer having the thickness of 1500 angstroms.

When the above-mentioned films, each of which has a different amount of Mo, are deposited on the non-magnetic substrate in the ascending order, the amount of Mo increases in the intermediate layer towards the direction from the non-magnetic substrate upwards.

In a manner similar to the 103rd disk, the coercive force, the output level of reproduction, and the media noise have been measured in the 106th disk. As the results of measurement, it has been found that the coercive force, the output level of reproduction, and the media noise have been measured as 2630 oersteds, 225 µV, and 4.88 µVrms, respectively.

Thus, it is noted that the magnetic characteristic is improved when the intermediate layer has the films each of which has the different amount of Mo as described above.

Although the amount of Mo increases in the intermediate layer towards a direction from the non-magnetic substrate upwards in the above-mentioned embodiment, the amount of Cr or Zr may increase in the intermediate layer towards a direction from the non-magnetic substrate upwards.

As readily understood from the first embodiment, the media noise decreases so that the S/Nm increases when the magnetic layer includes Co, Pt, and Mo. When the magnetic layer includes Co, Pt, and Mo, the remanence may decrease in the magnetic layer. In order to minimize the decrease of the remanence, Co is included in the magnetic layer between 40 and 95 atomic percent. Pt is included in the magnetic layer between 5 and 30 atomic percent. The Mo is included in the magnetic layer between 0 and 30 atomic percent (exclusive zero).

In addition, the intermediate layer may include as an additional intermediate element at least one selected from the group consisting of wolfram, boron, vanadium, niobium, tantalum, iron, nickel, rhenium, copper, zirconium, tin, phosphorus, silicon, gallium, germanium, hafnium, aluminum, and titanium. In order to improve the coercive force, the amount of the additional intermediate element is not greater than 30 atomic percent. When at least one of Cu, Zr, B. Zn, Ta, and Nb is further included in the intermediate layer, the media noise further decreases. Specifically, when Zr is further included in the intermediate layer, the media noise becomes very low.

The magnetic layer may include as an additional magnetic element at least one selected from the group consisting of tantalum, boron, chromium, oxygen, nitrogen, niobium, manganese, zinc, wolfram, plumbum, rhenium, vanadium, and zirconium. In order to improve the coercive force, the amount of the additional element is not greater than 30 atomic percents.

Figure 5:
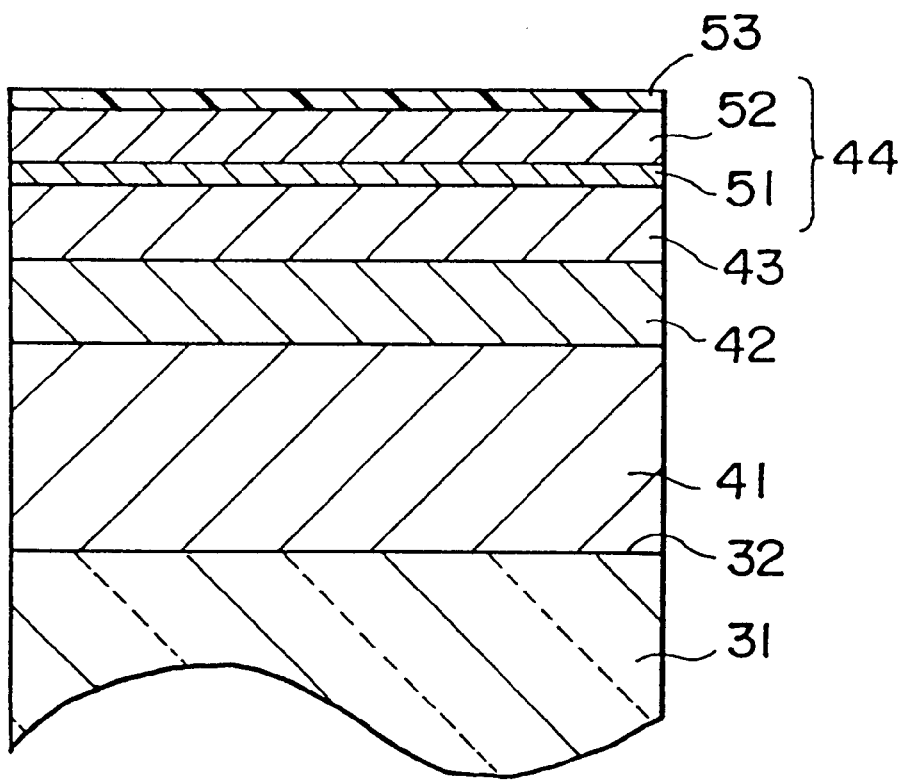
FIG. 5 shows a side view, partially in section, of a magnetic recording medium according to another embodiment of this invention.

Referring to FIG. 5, description will be made as regards a magnetic recording medium according to a second embodiment of this invention. The illustrated magnetic recording medium comprises a non-magnetic substrate 31 which has a principal surface 32 directed upwards in FIG. 5, a first intermediate layer or lamina 41 on the principal surface 12, a second intermediate layer or lamina 42 on the first layer 41, and a magnetic layer 43 on the second intermediate layer 42. In the example being illustrated, the non-magnetic substrate 31 is composed of a soda-lime glass. The first intermediate layer 41 has a thickness of 1500 angstroms and is composed of Cr. The second intermediate layer 42 has a thickness of 500 angstroms and is composed of CrMo. The first and the second intermediate layers may be called first and second backing layers, respectively. The magnetic layer 43 has a thickness of 400 angstroms and is composed of CoPtMo.

On manufacturing the magnetic recording medium illustrated in FIG. 5, the non-magnetic substrate 31 is prepared which is formed as a disk shaped soda-lime plate having a diameter of 65 millimeters and a thickness of 0.9 millimeters. The non-magnetic substrate 31 has a front surface and a rear surface which are directed upwards and downwards in FIG. 5, respectively.

The non-magnetic substrate 31 is introduced into a sputtering apparatus of a radio frequency magnetron type (not shown). The pressure in the sputtering apparatus is reduced to a pressure lower than $5 \times 10^{-7}$ Torrs. An argon gas is introduced as a sputtering gas into the sputtering apparatus at a gas pressure of 10 milli Torrs. In addition, the non-magnetic substrate 31 is kept at a room temperature.

By the use of a target of Cr in atomic percents, the first intermediate layer 41 is deposited on the principal surface 32 to the thickness of 1500 angstroms when an electric power is supplied to the Cr target at an electric power density of 2.5 W/cm².

After deposition of the first intermediate layer 41, the second intermediate layer 42 is deposited on the first intermediate layer 41 to the thickness of 500 angstroms by the use of a target of $Cr_{90}Mo_{10}$ in the atomic percent when the electric power is supplied to the $Cr_{90}Mo_{10}$ target at the electric power density of 2.5 W/cm².

Subsequently, the magnetic layer 43 of $Co_{76}Pt_{16}Mo_8$ is deposited on the second intermediate layer 42 by the use of a target of $Co_{76}Pt_{16}Mo_8$ and the argon gas to the thickness of 400 angstroms within the sputtering apparatus.

A protection layer 44 is formed on the magnetic layer 43 to protect the magnetic layer 43 from erosion or destruction. In the illustrated example, it is noted that the protection layer 44 comprises a first protection film 51 on the magnetic layer 43 and a second protection film 52 formed on the first protection film 51 in a manner to be presently described.

Specifically, Cr is used as the first protection film 51 in the illustrated example. The first film 51 of Cr is deposited within the sputtering apparatus by the use of the Cr target and the argon gas to the thickness of 50 angstroms. Similarly, carbon is used as the second protection film 52. The second protection film 52 of the carbon is deposited within the sputtering apparatus by the use of the carbon target and the argon gas to the thickness of 300 angstroms.

On the second protection film 52, a lubricant layer 53 is formed by a lubricant which may be composed of perfluoro polyether. The lubricant layer 53 has a thickness of 20 angstroms. Thus, the magnetic recording medium according to the second embodiment is manufactured through the above-mentioned steps and will be called a 107th disk.

In a similar manner described in the 107th disk, a first comparison disk is manufactured except that the first comparison disk has only the first intermediate layer 41. In addition, a second comparison disk is manufactured except that the second comparison disk has only the second intermediate layer 41.

By a vibrating type magnetrometer, the coercive force has been measured in each of the 107th disk and the first and the second comparison disks on applying a maximum magnetic field of 12 kilo oersteds that is directed towards a direction parallel to a layer surface. As a result, the coercive force has been measured in each of the 107th disk and the first and the second comparison disks as shown in Table 6.

TABLE 6

|  | Hc (Oe) | OUTPUT LEVEL OF REPRODUCTON (pV) | Nm (pV) | S/Nm (dB) |
| --- | --- | --- | --- | --- |
| 107th disk | 2000 | 150 | 2.45 | 35.7 |
| 1st comparison disk | 1600 | 110 | 2.40 | 33.2 |
| 2nd comparison disk | 2000 | 148 | 3.65 | 32.2 |

Furthermore, an output level or reproduction has been measured in each of the 107th disk and the first and the second comparison disks. On measuring the output level of reproduction, a film type magnetic head is used which has a coil of a turn number of 50, a track width of 6 $\mu$m, and a gap length of 0.25 $\mu$m. When a relative speed is kept at 6 meters/sec between the film type magnetic head and each of the 107th disk and the first and the second comparison disks and a flying height is kept at 0.055 $\mu$m between the film type magnetic head and each of the 107th disk and the first and the second comparison disks, the output level of reproduction has been measured at a track recording density of 80 kfci. As a result, the output level of reproduction has been measured as shown in Table 6.

By the use of a spectrum analyzer, a noise spectrum has been measured as a media noise (Nm) in each of the 107th disk and the first and the second comparison disks on reproduction of information at a carrier frequency of 9.4 MHz and a frequency band of 15 MHz. As a result, the media noise has been measured as shown in Table 6. In each of the 107th disk and the first and the second comparison disks, a signal-to-noise ratio (S/Nm) has been calculated on the basis of the media noise as shown in Table 6.

As readily understood from Table 6, it has been found that the magnetic characteristic of the 107th disk is greater than that of the first and the second comparison disks.

In a manner similar to the 107th disk, 108th through 113th disks are manufactured except that each of the 108th through the 113th disks has the first and the second intermediate layers of which thicknesses are different from the thicknesses of the first and the second intermediate layers in the 107th disk. In this case, a sum thickness of the first and the second intermediate layers is equal to 2000 angstroms in each of the 108th through the 113th disks. Namely, the 108th through the 113th disks are manufactured with changing the thicknesses of both first and second intermediate layers within a range between 0 angstroms and 2000 angstroms.

The coercive force, the output level of reproduction, and the media noise has been measured in each of the 108th through 113th disks. The signal-to-noise ratio (S/Nm) is calculated in each of the 108th through the 113th disks on the basis of the media noise in a manner known in the art. The results is shown in FIG. 6.

Figure 6:
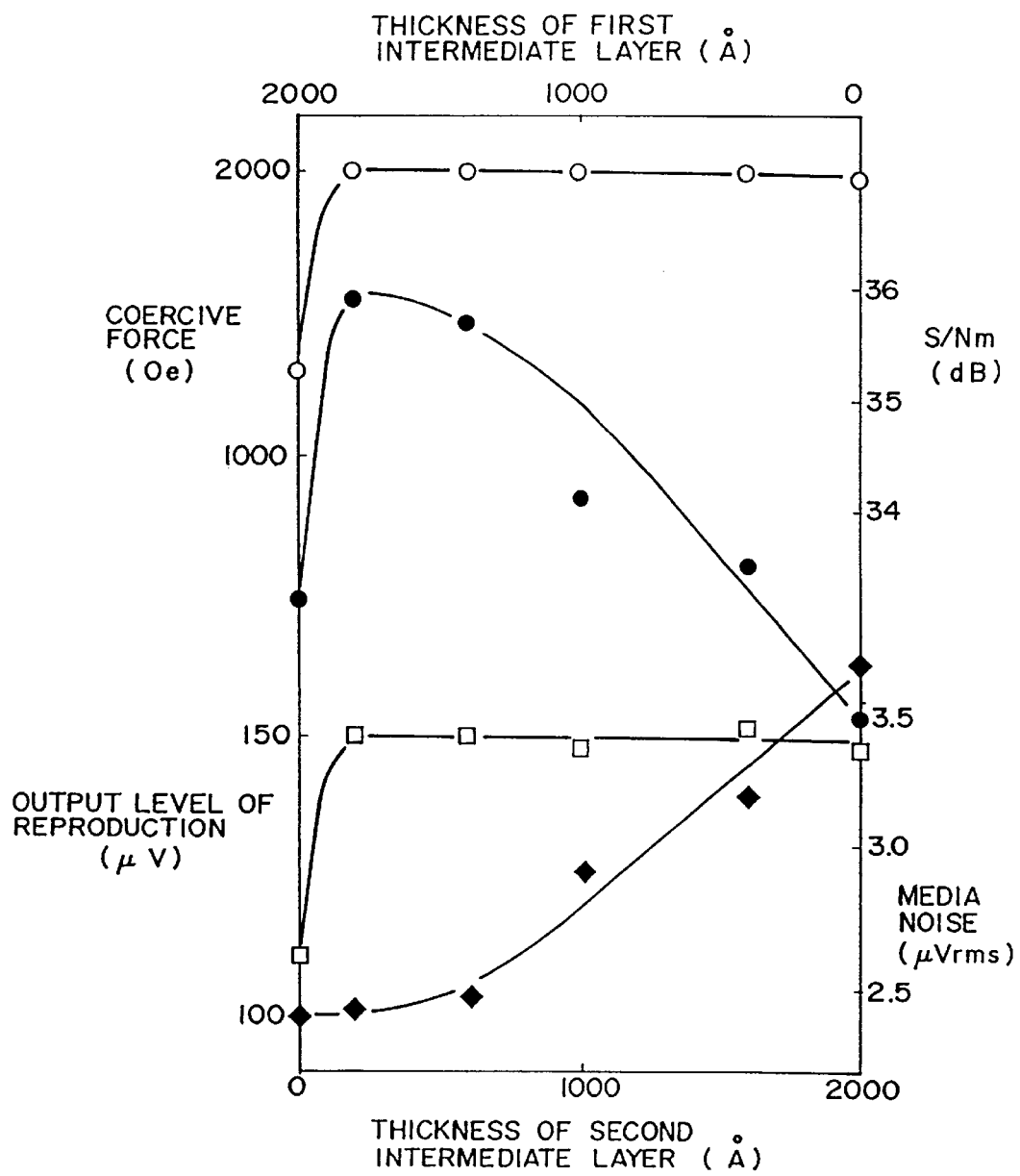
FIG. 6 is a graphical representation for use in describing magnetic characteristics on changing a film thickness of each of first and second films in the magnetic recording medium illustrated in FIG. 5.

In FIG. 6, each of the white circles represents the coercive force. Each of the white squares represents the output level of the reproduction. Each of the black squares represents the media noise. Each of the black circles represents the S/Nm. As readily understood from FIG. 6, it has been found that the media noise increases as the thickness of the second intermediate layer increases. Furthermore, it has been found that the S/Nm increase when the thickness of the second intermediate layer is greater than that of the first intermediate layer. Accordingly, it is necessary to make the thickness of the second intermediate layer be less than that of the first intermediate layer in order to improve the media noise and the S/Nm.

Next, the non-magnetic substrate is prepared which is formed as a disk shaped soda-lime plate having a diameter of 48 millimeters and a thickness of 0.64 millimeters. In a manner similar to the 107th disk, the first intermediate layer of Cr is deposited on the non-magnetic substrate to the thickness of 1200 angstroms. After deposition of the first intermediate layer, the second intermediate layer of $Cr_{95}Mo_5$ is deposited on the first intermediate layer to the thickness of 300 angstroms. Subsequently, the magnetic layer of $Co_{79}Pt_{13}Mo_8$ is deposited on the second intermediate layer to the thickness of 450 angstroms.

TABLE 7

|  | SECOND INTERMEDIATE LAYER | MAGNETIC LAYER | PROTECTION LAYER | S/Nm (dB) |
| --- | --- | --- | --- | --- |
| 114th disk | $Cr_{95}Mo_5$ | $Co_{79}Pt_{13}Mo_8$ | $SiO_2$ | 35.2 |
| 115th disk | $Cr_{90}Mo_8Zr_2$ | $Co_{75}Pt_{12}Mo_{13}$ | Cr/SiC | 36.4 |
| 116th disk | $Cr_{86}Mo_{10}Zr_4$ | $Cp_{78}Pt_{16}Mo_6$ | C | 34.9 |
| 117th disk | $Cr_{87}Mo_{10}B_3$ | $Co_{73}Pt_{14}Mo_{13}$ | $Si_3N_4$ | 35.8 |
| 118th disk | $Cr_{80}Mo_{16}Ta_2P_2$ | $Co_{74}Pt_{18}Mo_8$ | $ZrO_2$ | 36.2 |
| 119th disk | $Cr_{74}Mo_{18}Ta_5Al_3$ | $Co_{80}Pt_{14}Mo_6$ | MoSi | 34.8 |
| 120th disk | $Cr_{83}Mo_9V_4Nb_4$ | $Co_{75}Pt_{10}Mo_{15}$ | $Ta_2O_5$ | 35.6 |
| 121st disk | $Cr_{68}Mo_{22}Ti_8Hf_2$ | $Co_{75}Pt_{11}Mo_{14}$ | BN | 35.9 |
| 122nd disk | $Cr_{80}Mo_{16}Fe_4$ | $Co_{66}Pt_{16}Mo_{18}$ | $TiO_2$ | 36.1 |
| 123rd disk | $Cr_{79}Mo_{17}Ni_2Re_2$ | $Co_{75}Pt_{15}Mo_{10}$ | $WO_3$ | 35.1 |
| 124th disk | $Cr_{90}Mo_8Si_1Ge_1$ | $Co_{76}Pt_{16}Mo_8$ | C—Si | 36.4 |
| 125th disk | $Cr_{77}Mo_{20}Cu_3$ | $Co_{73}Pt_{21}Mo_6$ | $Mo_2O_3$ | 34.9 |
| 126th disk | $Cr_{88}Mo_8Ga_4$ | $Co_{74}Pt_{13}Mo_{13}$ | TiN | 35.7 |

TABLE 7-continued

| | SECOND INTERMEDIATE LAYER | MAGNETIC LAYER | PROTECTION LAYER | S/Nm (dB) |
|---|---|---|---|---|
| 127th disk | $Cr_{93}Mo_7$ | $Co_{80}Pt_{20}$ | C | 35.5 |

After deposition of the magnetic layer, the protection layer of $SiO_2$ is formed on the magnetic layer to the thickness of 140 angstroms. Thus, the magnetic recording medium according to the second embodiment is manufactured through the above-mentioned steps and will be called a 114th disk. The S/Nm has been measured in the 114th disk as shown in Table 7.

In a manner similar to the 114th disk, 115th through 127th disks are manufactured except that each of the 115th through the 127th disks comprises the second intermediate layer, the magnetic layer, and the protection layer each of which has the composition shown in Table 7. The S/Nm has been measured in each of the 115th through the 127th disks as shown in Table 7.

As readily understood from Table 7, it has been found that the S/Nm increases even when the second intermediate layer has another element or elements in addition to Cr and Mo.

The non-magnetic substrate is prepared which is formed as a disk shaped soda-lime plate having a diameter of 48 millimeters and a thickness of 0.64 millimeters. In a manner similar to the 107th disk, the first intermediate layer of Cr is deposited on the non-magnetic substrate to the thickness of 2000 angstroms. After deposition of the first intermediate layer, the second intermediate layer of $Cr_{85}Mo_{15}$ is deposited on the first intermediate layer to the thickness of 600 angstroms. Subsequently, the magnetic layer of $Co_{73}Pt_{12}Mo_{13}Ta_2$ is deposited on the second intermediate layer to the thickness of 500 angstroms.

After deposition of the magnetic layer, the protection layer of $Ta_2O_5$ is formed on the magnetic layer to the thickness of 160 angstroms. Thus, the magnetic recording medium according to the second embodiment is manufactured through the above-mentioned steps and will

TABLE 8

| | SECOND INTERMEDIATE LAYER | MAGNETIC LAYER | PROTECTION LAYER | S/Nm (dB) |
|---|---|---|---|---|
| 128th disk | $Cr_{85}Mo_{15}$ | $Co_{73}Pt_{12}Mo_{13}Ta_2$ | $Ta_2O_5$ | 35.6 |
| 129th disk | $Cr_{92}Mo_8$ | $Co_{78}Pt_{10}Mo_5Cr_7$ | $SiO_2$ | 36.1 |
| 130th disk | $Cr_{95}Mo_5$ | $Co_{71}Pt_{15}Mo_{10}Nb_4$ | $ZrO_2$ | 34.8 |
| 131st disk | $Cr_{87}Mo_{13}$ | $Co_{71}Pt_{10}Mo_{15}Mn_2O_2$ | C | 36.5 |
| 132nd disk | $Cr_{90}Mo_8Zr_2$ | $Co_{70}Pt_{10}Mo_{12}W_8$ | $WO_3$ | 34.9 |
| 133rd disk | $Cr_{86}Mo_{10}Zr_4$ | $Co_{68}Pt_{14}Mo_{13}Zr_5$ | $TiO_2$ | 36.0 |
| 134th disk | $Cr_{82}Mo_{12}Zr_6$ | $Co_{75}Pt_{10}Mo_{12}V_3$ | CrN | 34.8 |
| 135th disk | $Cr_{90}Mo_8B_2$ | $Co_{73}Pt_{13}Mo_{12}Zn_1N_1$ | TiN | 36.6 |
| 136th disk | $Cr_{89}Mo_{10}B_1$ | $Co_{15}Pt_{20}Mo_3W_2$ | $Ta_2O_5$ | 35.9 |
| 137th disk | $Cr_{82}Mo_{15}Zn_3$ | $Co_{72}Pt_{12}Mo_{12}Re_2Pb_2$ | $Al_2O_3$ | 35.8 | be called a 128th disk. The S/Nm has been measured in the 128th disk as shown in Table 8.

In a manner similar to the 128th disk, 129th through 137th disks are manufactured except that each of the 129th through the 137th disks comprises the second intermediate layer, the magnetic layer, and the protection layer each of which has the composition shown in Table 8. The S/Nm has been measured in each of the 129th through the 137th disks as shown in Table 8.

As readily understood from Table 8, it has been found that the S/Nm increases even when the magnetic layer has another element or elements in addition to Co, Pt, and Mo.

Subsequently, the non-magnetic substrate is prepared which is formed as a disk shaped soda-lime plate having a diameter of 65 millimeters and a thickness of 0.9 millimeters. The non-magnetic substrate is introduced into a sputtering apparatus of a radio frequency magnetron type. The pressure in the sputtering apparatus is reduced to a pressure lower than $4 \times 10^{-8}$ Torrs. The argon gas is introduced as the sputtering gas into the sputtering apparatus at a gas pressure of 10 milli Torrs. In addition, the non-magnetic substrate is kept at a room temperature.

By the use of the Cr target, the second intermediate layer is deposited on the non-magnetic substrate to the thickness of 1300 angstroms at the electric power density of 2.5 W/cm$^2$. By the use of the Cr and Mo targets, the second intermediate layer is deposited on the first intermediate layer to the thickness of 400 angstroms. In the deposition of the second intermediate layer, the electric power is supplied to the Cr target at the electric power density of 2.5 W/cm$^2$. The electric power is supplied to the Mo target with the electric power density being successively changed from 0.1 W/cm$^2$ to 1.2 W/cm$^2$. As a result, it has been found that the amount of Mo increases in the second intermediate layer towards a direction from the first intermediate layer upwards.

After deposition of the second intermediate layer, the magnetic layer of $Co_{74}Pt_{13}Mo_{13}$ is deposited on the second intermediate layer by the use of the target of $Co_{74}Pt_{13}Mo_{13}$ and the argon gas to the thickness of 450 angstroms within the sputtering apparatus. Subsequently, a Cr layer is formed on the magnetic layer by the use of the argon gas to the thickness of 50 angstroms. A $SiO_2$ layer is formed on the Cr layer by the use of the argon gas to the thickness of 300 angstroms. The Cr layer and the $SiO_2$ layer are collectively used as the protection layer. On the $SiO_2$ layer, the lubricant layer is formed by the lubricant which may be composed of perfluoro polyether. The lubricant layer has a thickness of 20 angstroms. Thus, the magnetic recording medium according to the second embodiment is manufactured through the above-mentioned steps and will be called a 138th disk.

By the vibrating type magnetometer, the coercive force of the 138th disk has been measured on applying the maximum magnetic field of 12 kilo oersteds that is directed towards the direction parallel to a layer surface. As a result of measurement of the coercive force, it has been found that the coercive force has been measured as 2100 oersteds.

Furthermore, an output level of reproduction has been measured in the 138th disk. On measuring the output level of reproduction of the 138th disk, the film type magnetic head is used which has a coil of a turn number of 50, a track width of 6 $\mu$m, and a gap length of 0.25 $\mu$m. When the relative speed is kept at 6 meters/sec between the film type magnetic head and the 138th disk and the flying height is kept at 0.055 $\mu$m between the film type magnetic head and the 138th disk, the output level of reproduction has been measured at a track recording density of 80 kfci. As a result, the output level of reproduction has been measured as 163 $\mu$V.

By the use of the spectrum analyzer, the noise spectrum has been measured as the media noise (Nm) in the 103rd disk on reproduction of information at the carrier frequency of 9.4 MHz and a frequency band of 15 MHz. As a result of measurement of the media noise, the media noise has been measured in the 103rd disk as 2.32 µVrms. In addition, the S/Nm is calculated in the 138th disk on the basis of the media noise. As a result, the S/Nm has been 36.9 dB.

As readily understood from the above description, it has been found that the magnetic characteristic and the S/Nm are improved when the amount of Mo increases in the second intermediate layer towards the direction from the first intermediate layer upwards.

Although the second intermediate layer further includes as an additional intermediate element at least one selected from the group consisting of boron, vanadium, niobium, tantalum, iron, nickel, rhenium, copper, zirconium, zinc, phosphorus, silicon, gallium, germanium, hafnium, aluminum, and titanium in the second embodiment, wolfram may be further used as the additional intermediate layer.

Although the magnetic layer further includes as an additional magnetic element at least one selected from the group consisting of tantalum, chromium, oxygen, nitrogen, niobium, manganese, zinc, wolfram, plumbum, rhenium, vanadium, and zirconium in the second embodiment, boron may be further used as the additional magnetic element.

A crystal glass or an aluminum plate may be used as the non-magnetic substrate although the soda-lime plate is used as the non-magnetic substrate in each of the first and the second embodiments.

The protection layer has a single film or a plurality of films as described in each of the first and the second embodiments. One of silicon dioxide, carbon, zirconium dioxide, boron nitride, chromium, and chromium-molybdenum alloy is used as the above-mentioned film.

Although the perfluoro polyether is used as the lubricant layer in each of the first and the second embodiments, at least one of fatty acid, fatty amides, fatty esters, and fluorocarbons may also be used.

What is claimed is:

1. A method of manufacturing a magnetic recording medium having a non-magnetic substrate, at least one backing layer formed on said non-magnetic substrate, and a magnetic layer formed on said backing layer, wherein:

said non-magnetic substrate is a glass substrate;

said backing layer is a Cr—Mo alloy comprising chromium and molybdenum;

said magnetic layer is a Co—Pt alloy comprising cobalt and platinum;

said method comprising the steps of:
  forming said Cr—Mo alloy with molybdenum in an amount of 8–80% by sputtering;
  forming said Co—Pt alloy with platinum in an amount of 5–30% by sputtering; and
  keeping said non-magnetic substrate at a temperature between room temperature and 400° C., inclusive, on forming each of said backing and said magnetic layers for providing a lattice distance in (110) surface of said backing layer approaching a lattice distance in (002) surface of said magnetic layer.

2. A method as claimed in claim 1, wherein said backing layer is formed as a first backing layer formed on said non-magnetic substrate and a second backing layer formed on said first backing layer.

3. A method as claimed in claim 2, wherein said first backing layer has a thickness greater then that of said second backing layer.

4. A method as claimed in claim 1, further comprising the step of forming a protecting layer on said magnetic layer.

* * * * *